United States Patent
Usui et al.

(10) Patent No.: US 9,732,183 B2
(45) Date of Patent: Aug. 15, 2017

(54) METHOD FOR MANUFACTURING HOLE-FILLING PRINTED WIRING BOARD, CURABLE RESIN COMPOSITION AND HOLE-FILLING PRINTED WIRING BOARD

(71) Applicant: SAN-EI KAGAKU CO., LTD., Tokyo (JP)

(72) Inventors: Yukihiro Usui, Saitama (JP); Kazuya Takahashi, Saitama (JP); Kazunori Kitamura, Saitama (JP)

(73) Assignee: SAN-EI KAGAKU CO., LTD., Tokyo (JP)

( * ) Notice: Subject to any disclaimer, the term of this patent is extended or adjusted under 35 U.S.C. 154(b) by 0 days.

(21) Appl. No.: 15/252,590

(22) Filed: Aug. 31, 2016

(65) Prior Publication Data
US 2017/0066868 A1 Mar. 9, 2017

(30) Foreign Application Priority Data
Sep. 8, 2015 (JP) .................................. 2015-192164

(51) Int. Cl.
| | | |
|---|---|---|
| H05K 1/00 | (2006.01) | |
| C08G 59/24 | (2006.01) | |
| H05K 3/00 | (2006.01) | |
| C08G 59/40 | (2006.01) | |
| C08G 59/50 | (2006.01) | |

(52) U.S. Cl.
CPC ........... *C08G 59/245* (2013.01); *C08G 59/40* (2013.01); *H05K 3/0094* (2013.01); *C08G 59/5073* (2013.01); *H05K 3/0047* (2013.01); *H05K 2201/0959* (2013.01); *H05K 2203/0207* (2013.01)

(58) Field of Classification Search
CPC .. H05K 1/00; H05K 1/02; H05K 1/09; H05K 1/11; H05K 1/16; H05K 1/115; H05K 1/251; H05K 1/298; H05K 3/00; H05K 3/30; H05K 3/42; H05K 3/47; H05K 3/94; H05K 3/427; H05K 7/00; H01L 21/4763; C08G 59/44; C08G 59/245
USPC ............... 174/258, 251, 257, 260, 262, 266; 438/637; 361/760; 29/852
See application file for complete search history.

(56) References Cited

FOREIGN PATENT DOCUMENTS

| | | | |
|---|---|---|---|
| JP | 2007-509487 | A | 4/2007 |
| JP | 2009-269994 | A | 11/2009 |
| JP | 2012-521716 | A | 9/2012 |
| JP | 2014-187153 | A | 2/2014 |

*Primary Examiner* — Xiaoliang Chen
(74) *Attorney, Agent, or Firm* — Juan Carlos A. Marquez; Marquez IP Law Office, PLLC

(57) ABSTRACT

A redundant part of a plated through hole that is formed in a printed wiring board is removed by a back drilling method; a penetration hole is filled entirely with a curable resin composition for hole filling; the curable resin composition is initially heated at a temperature less than 100° C. so that a curing rate of the curable resin composition may be 60% to 85%; and the curable resin composition is subsequently heated at a temperature 130° C. to 200° C. so that the curable resin composition may be cured completely, where the curable resin composition contains 1 part by mass to 200 parts by mass of a curing agent with respect to 100 parts by mass of liquid epoxy resin, and contains no solvent.

7 Claims, 2 Drawing Sheets

METHOD FOR MANUFACTURING HOLE-FILLING PRINTED WIRING BOARD, CURABLE RESIN COMPOSITION AND HOLE-FILLING PRINTED WIRING BOARD

CROSS REFERENCE

The present application claims priority to Japanese Patent Application No. 2015-192164 filed Sep. 8, 2015, which is hereby incorporated by reference in its: entirety.

TECHNICAL FIELD

The invention of the present application relates to a method for manufacturing a hole-filling printed wiring board, a curable resin composition for hole filling, which is used exclusively in the method, and a hole-filling printed wiring board manufactured by the method.

BACKGROUND ART

In a through hole, a redundant part which does not contribute to interlayer conductivity sometimes exists. In the case of transmitting a high speed signal via such a through hole in which the redundant part exists, the redundant part acts as an open stub, which causes resonance of the signal. Consequently, pass characteristics of a frequency attributed to a wavelength thereof deteriorate.

Then, the through hole is dug (excavated) with a drill, thereby removing the stub (see PTL 1).

CITATION LIST

Patent Literature

[PTL 1]
JP 2014-167153 A

SUMMARY OF INVENTION

Technical Problem

However, there is a problem that, in the case where a space made by digging is filled with resin and the resin is then completely cured, a void 9 (see FIG. 2) is generated. In the light of the above-described problem, the invention of the present application aims to provide a technical means that can prevent such generation of the void, even in the case where the dug space made by a back drilling method is filled with the resin and the resin is then completely cured,

Solution to Problem

As a result of keen study for attaining the above-described purposes, the inventors have made the invention of the present application.

More specifically, the invention according to a first aspect is a method for manufacturing a hole-filling printed wiring board, including: removing a redundant part of a plated through hole that is formed in a printed wiring board by a back drilling method; filling a penetration hole entirely with a curable resin composition for hole filling; initially heating the filled curable resin composition at a temperature less than 100° C. so that a curing rate of the curable resin composition becomes 60% to 85%; and subsequently heating the filled curable resin composition at a temperature 130° C. to 200° C. so as to cure the curable resin composition completely, wherein the curable resin composition contains 1 part by mass to 200 parts by mass of a curing agent, with respect to 100 parts by mass of liquid epoxy resin, and contains no solvent.

The invention according to a second aspect is a method for manufacturing a hole-filling printed wiring board, including: removing a redundant part of a plated through hole that is formed in a printed wiring board by a back drilling method; filling a penetration hole entirely with a curable resin composition for hole filling; initially heating the filled curable resin composition at a temperature less than 80° C. so that a curing rate of the curable resin composition becomes 70%to 80%; and subsequently heating the filled curable resin composition at a temperature 130° C. to 180° C. so as to cure the filling resin completely, wherein the curable resin composition contains 1 part by mass to 100 parts by mass of a curing agent with respect to 100 parts by mass of liquid epoxy resin, and contains no solvent.

The printed wiring board of the present invention is preferably made of a resin-based material that contains glass cloth.

The curable resin composition of the present invention preferably further contains 10 parts by mass to 1,000 parts by mass of filler.

The curable resin composition of the present invention preferably further contains a curing agent with a curing initiation temperature of 100° C. or more.

The method for manufacturing the hole-filling printed wiring board of the present invention preferably further including flattening at least a part of a surface of the printed wiring board after the curable resin composition is completely cured.

The invention according to a third aspect is a curable resin composition for hole filling, which is used exclusively in the manufacturing method according to the first or second aspects.

The invention according to a fourth aspect is a hole-filling printed wiring board, including: a penetration hole from which a stub is removed; and a completely cured product of the curable resin composition according to the third aspect; wherein the penetration hole is filled entirely with, the completely cured, product, wherein the hole-filling printed wiring board is free of void, and wherein a surface of the hole-filling printed wiring board is flattened.

Advantageous Effects of Invention

According to the invention of the present application, the generation of a void car; be prevented, ever; in the case where the dug space made by the back drilling method is filled with the resin and the resin is then completely cured.

DESCRIPTION OF EMBODIMENT

Hereinafter, the invention of the present application will be explained in detail by way of the best mode with reference to the accompanying drawings. Incidentally, viscosity is measured in accordance with JIS Z8803, and particle diameters are measured in accordance with JIS K5600-2-5.

Figure 1A:
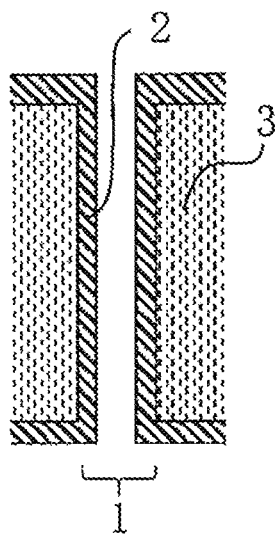
FIGS. 1A to 1D are process cross-sectional views for explaining a method for manufacturing a hole-filling printed wiring board according to the invention of the present application.

In a method for manufacturing a hole-filling printed wiring board of the invention of the present, application, a printed wiring board having a plated through hole 1 (see FIG. 1A) (that is, the plated through hole is a penetration hole with an inner wall (a wall surface) that is covered with plate 2 (see FIG. 1A)) is used.

Such a printed wiring board is manufactured, for example, by a following method. That is, a circuit is formed on a surface of a base (a substrate); a laminated plate is thereafter made of this base; the penetration hole is subsequently formed in the laminated plate; and then, the inner wall of the penetration hole is plated so as to form the plated through hole.

In the case where the base 3 (see FIG. 1A) is made of an organic material, in particular, resin (epoxy resin or the like) containing glass cloth, effects of the invention of the present application can be exhibited particularly remarkably. Namely, the generation of a void and the like can be prevented.

The laminated plate can be made of the base, for example, by: superimposing the desired number of the bases; and unifying them into one by heat press or the like.

The penetration hole can be formed in the laminated plate specifically with a drill or the like.

The inner wall of the penetration hole can be plated, for example, by chemical plating and/or electroplating or the like.

A plating thickness of the plated through hole ranges, for example, from 10 μm to 50 μm. As plating metal species, copper and the like can be exemplified. A pore size (an inner diameter) of the plated through hole ranges, for example, from 100 μm to 800 μm, and a pore length thereof ranges, for example, from 200 μm to 10,000 μm.

In the method for manufacturing the hole-filling printed wiring board of the invention of the present application, a redundant part (including an unnecessary part and the like) of the plated through hole is removed by a back drilling method.

As the redundant part of the plated through hole, for example, a through hole stub and the like can be exemplified.

The redundant part, of the plated through hole can be removed by the back drilling method, for example, with a drill, by digging along a central axis of the plated through hole from a surface of the printed wiring board to a depth at which the redundant part can be removed. A digging pore size is larger than the pore size of the plated through hole generally by about 20% to about 200%, and specifically ranges from 120 μm to 1,600 μm.

Figure 1B:
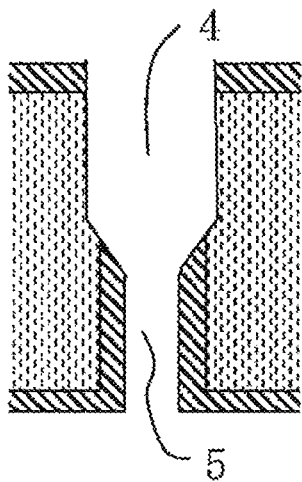
Figure 1C:
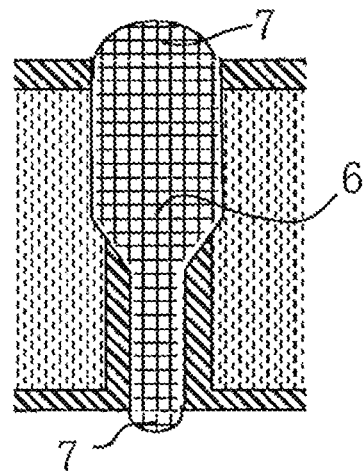

In the method for manufacturing the hole-filling printed wiring board of the invention of the present application, the entire penetration hole [that is, the above-described dug space 4 (see FIG. 1B) (namely, a space generated by the removal of the redundant part) and a remaining part 5 of the plated through hole (see FIG. 1B)] is filled with a curable resin composition 6 for hole filling (see FIG. 1C).

As the curable resin composition for hole filling, a composition that contains liquid epoxy resin and filler and does not contain solvent is used.

The liquid epoxy resin denotes epoxy resin in a liquid state or a semi-solid state at a normal temperature, and for example, epoxy resin having flowability at the normal temperature can be exemplified. Viscosity (mPa·s, at a room temperature) of such liquid epoxy resin is, for example, 20,000 or less, and preferably ranges from 1,000 to 10,000.

Specifically, as the liquid epoxy resin, bisphenol A-type epoxy resin, for example, epoxy resin represented by a following chemical formula 1 can be exemplified, where the liquid epoxy resin may contain one kind or more.

[Chemical Formula 1]

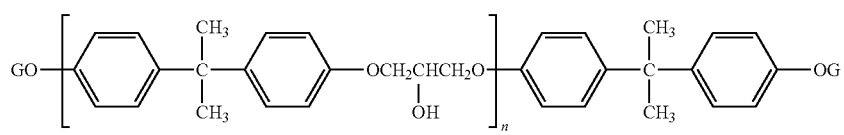

[In the formula, n represents 0 or 1, and G represents a glycidyl group.]

Further, as specific examples of the liquid epoxy resin, bisphenol F-type liquid epoxy resin, for example, epoxy resin represented by a following chemical formula 2 can be exemplified, where the liquid epoxy resin may contain one kind or more.

[Chemical Formula 2]

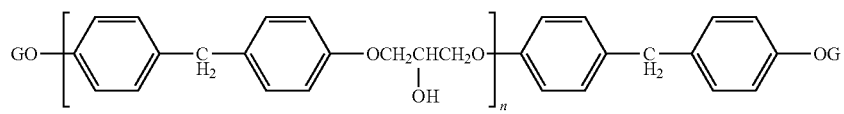

[In the formula 2, n represents 0 or 1, and G: represents a glycidyl group.]

Moreover, specific examples of the liquid epoxy resin include: phenol novolac-type liquid epoxy resin; multifunctional glycidylamine; naphthalene-type, diphenylthioether (sulfide)-type, trityl-type and alicyclic-type liquid epoxy resin; liquid epoxy resin prepared by alcohols; diallyl bis-A-type, methyl resorcinol-type and bisphenol AD-type liquid epoxy resin;

N,N,O-tris (glycidyl)-p-aminophenol; and the like, where the liquid epoxy resin may contain one kind or more among them.

Preferable examples of the liquid epoxy resin include: bisphenol A-type, F-type and AD-type epoxy resin; phenol novolac-type epoxy resin; multifunctional glycidylamine;

N,N,O-tris (glycidyl)-p-aminophenol; and the like, where the liquid epoxy resin may contain one kind or more among them.

Commercial products of the liquid epoxy resin include: "EPON™ Resin 828" (bisphenol A-type epoxy resin) and "EPON (trademark) Resin 807" (bisphenol F-type epoxy resin) (produced by Hexion Inc.); "ELM-100" (multifunctional glycidylamine, produced by Sumitomo Chemical Co., Ltd.); "RE-305S" (phenol novolac-type epoxy resin, produced by Nippon Kayaku Co., Ltd.); and the like, where one kind or more of them may be used.

A curing agent that can start at least initial curing reaction, which will be described below and the like, can be used. As the curing agent, a curing agent with a curing initiation temperature of less than 100° C. (for example, 60° C. or more and less than 100° C.), preferably less than 80° C. (for example, 70° C. or more and less than 80° C.) can be exemplified. If the curing initiation temperature is too low, preservation stability of the curable resin composition for hole filling deteriorates and on the other hand, if the curing initiation temperature is too high, the effect for preventing the generation of a void cannot be obtained.

Incidentally, the "curing initiation temperature" denotes an initial changing point (a rising point) of a graph (a vertical axis represents a calorific value, and a horizontal axis represents a heating temperature) obtained by differential scanning calorimetry (DSC) during heating.

Examples of the curing agent include: aliphatic (or modified aliphatic) polyamine; aromatic (or modified aromatic) polyamine; imidazoles (for example, 2-ethyl-4-methylimidazole and the like); amines (for example, primary, secondary and tertiary amine, aromatic amine and the like); amine adduct obtained by modifying amines [for example, amine/acid anhydride (polyamide) adduct]; amide resin: poly amide amine; mercaptans; amine complexes of Lewis acid (for example, a BF3-amine complex and the like); organic acid hydrazides; melamines; organic acid hydrazides; carboxylates of amines; onium salts; and the like, and one kind or more among them can be used.

The curing agent may also be a combination of two kinds or more of the curing agents. For example, a combination system of an imidazole compound and acid anhydride, a combination system of an imidazole compound and phenol resin and the like can be exemplified, and one kind cur more among them can be used.

As the curing agent, a mixture of below-listed curing agents and curing catalysts may also be used. Specific examples of the curing agent include: phenol resins; acid anhydrides; polycarboxylic acids; and latent curing agents [for example, dicyandiamides (DICY) and the like], and one kind or more among them can be used. Specific examples of the curing catalyst include: imidazole (2,4-diamino-6-[2'-methylimidazolyl-(1')]-ethyl-s-triazine and the like); tertiary amine; aromatic amine; boric acid ester; Lewis acid; organic metal compounds; organic acid metal salts; and the like, and one kind or more among them can be used.

For chemical resistance improvement and suppressing thermal expansion control of a cured product, a curing agent with a curing initiation temperature of 100° C. or more (for example, 100° C. to 200° C., typically 110° C. to 1S0° C.) may be further added. Specific examples of such a curing agent include:
2,4-diamino-6-[2'-methylimidazolyl-(1')]-ethyl-s-triazine;
2-phenyl-4,5-dihydroxymethylimidazole; hexahydrophthalic anhydride; and the like, and one kind or more among them can be used.

Commercial products of the curing agent or the curing catalyst with a curing initiation temperature of less than 100° C. include: "Fujicure (trademark) FXR-1020" (modified aliphatic polyamine, produced by T&K TOKA Corporation); "CUREZOL® 2E4MZ" (imidazoles, produced by SHIKOKU CHEMICALS CORPORATION); "2MZ" (imidazoles, produced by SHIKOKU CHEMICALS CORPORATION); "EPICURE (trademark) W" (modified aromatic polyamine, produced by Mitsubishi Chemical Corporation); "PN-23" (amine adduct, produced by Ajinomoto Fine-Techno Co., Inc.); and the like, and one kind or more among them can be used.

Commercial products of the curing agent or the curing catalyst with the curing initiation temperature of 100° C. or more include: "MEH-8000H" (phenol resins, produced by MEIWA PLASTIC INDUSTRIES, LTD.); "2PHZ" (imidazoles, produced by SHIKOKU CHEMICALS CORPORATION); "CUREZOL™ 2MZA-PW" (imidazoles, produced by SHIKOKU CHEMICALS CORPORATION); "RIKACID (trademark) MH-700" (acid anhydrides, produced by New Japan Chemical Co., Ltd.); and the like, and one kind or more among them can be used.

It is preferable that the curable resin composition for hole filling further contains filler. Such blend of the filler can prevent recess caused by curing shrinkage, and can improve curing characteristics (for example, chemical resistance, thermal expansion control and the like). Examples of the filler include inorganic filler (more specifically, silica, calcium carbonate, alumina, barium sulfate, aluminum hydroxide, talc and the like), and one kind or more of the filler can be used. A form of the filler is, for example, powder with an average particle diameter of 0.1 μm to 100 μm.

Besides, the curable resin composition for hole filling may contain: an antifoamer (for example, polydimethylsiloxane, a modified silicone-based, fluorine-based or polymer-based antifoamer, a surfactant, an emulsion-type antifoamer or the like); a colorant; a viscosity modifier; a thixotropic agent; a leveling agent; organic filler; a mold releasing agent; a surface preparation agent; a flame retardant; a plasticizer; an antimicrobial agent; an antifungal agent; a stabilizer; an antioxidant; a phosphor; or the like as an additive.

The curable resin composition for hole filling contains no solvent. In the case of containing solvent, the solvent is gasified so as to cause the generation of a void (a bubble) during thermal curing.

Viscosity (Pa·s, at 25° C.) of the curable resin composition for hole filling ranges, for example, from 10 to 100.

A formulation of the curable resin composition for hole filling contains: 1 part by mass to 200 parts by mass (preferably 1 part by mass to 100 parts by mass) of the curing agent; preferably 10 parts by mass to 1,000 parts by mass (most preferably 50 parts by mass to 150 parts by mass) of the filler; with respect to 100 parts by mass of the liquid epoxy resin. Further to this formulation, 1 part by mass to 200 parts by mass (preferably 1 part by mass to 100 parts by mass) of the curing agent with the curing initiation temperature of 100° C. or more may be added.

The curable resin composition for hole filling according to the invention of the present application is limited to a curable resin composition that is used exclusively in the method for manufacturing the hole-filling printed wiring board according to the invention of the present application.

The curable resin composition for hole filling can be filled, for example, by screen printing under atmospheric pressure or vacuum reduced pressure, a direct filling technique in which the through hole is filled with, ink directly, or the like.

In the method for manufacturing the hole-filling printed wiring board according to the invention of the present application, firstly, an initial heating step is carried out to cure a filling resin which is defined as the curable resin, composition filled in the hole. The initial curing temperature is less than 100° C. (for example, 40° C. or more and less than 100° C.), is preferably less than 90° C. (for example, 60° C. or more and less than 90° C.) and is more preferably less than 80° C. (for example, 60° C. or more and less than 80° C.). If the initial curing temperature is too low, the filling resin starts to be cured during the step of filling the hole with the curable resin composition. On the other hand, if the initial curing temperature is too high, the effect for preventing the generation of the void cannot be obtained.

The initial curing step is continued until an initial curing rate becomes 60% to 85%, preferably 65% or more (for example, 65% to 80%), and most preferably 70% or more (for example, 70% to 80%). If the initial, curing rate is too low, vaporization, of water or generation of gas cannot be suppressed during complete curing. Such a time for the initial curing step is, for example, 30 minutes to 180 minutes (typically 60 minutes to 120 minutes).

In the method for manufacturing the hole-filling printed wiring board according to the invention of the present application, the filling resin is heated ("post-heated") at 130° C. to 200° C., preferably at 130° C. to 180° C., and most preferably at 150° C. to 180° C. by subsequent heating step. If a post heating temperature is too low, heat resistance and chemical resistance of the cured product deteriorate. On the other hand, if the post heating temperature is too high, heat damage may be caused. A post heating time is, for example, 30 minutes to 180 minutes (typically 30 minutes to 60 minutes).

Figure 1D:
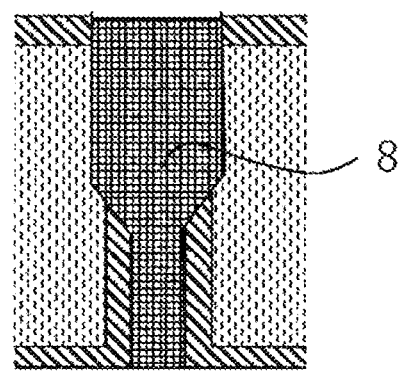
Figure 2:
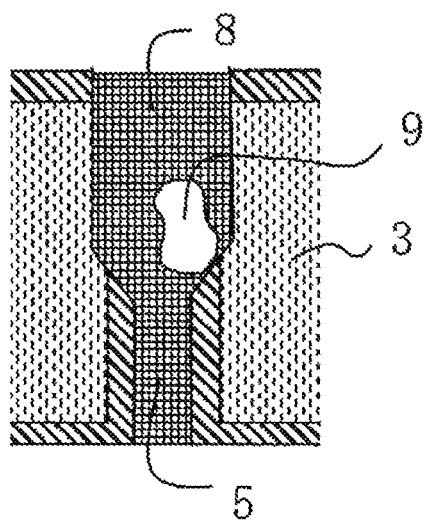
FIG. 2 is a cross-sectional view for illustrating that a void is generated in a hole-filling printed wiring board which is manufactured by a method omitting an initial curing process.

After obtaining the completely cured product of the filling resin as described above, at least a part of the surface or a whole surface of the printed wiring board is preferably flattened. Specifically, at least an exposed portion of the cured product of the filling resin is preferably flattened. For example, after completely curing the filling resin, an exposed projection 7 of the filling resin (see FIG. 1C), which is cured completely, is polished and removed with a buff, a belt sander or the like so the surface of the printed wiring board may be flat (refer to completely cured resin 8 in FIG. 1D).

As described above, the hole-filling printed wiring board, in which the penetration hole is entirely filled with the completely cured product of the curable resin composition for hole filling of the invention of the present application, and no void exists, can be manufactured.

In particular, the hole-filling printed wiring board, in which the penetration hole is entirely filled with the completely cured product of the curable resin composition for hole filling of the invention of the present application, no void exists, and the surface of the printed wiring board is flattened, can be manufactured.

EXAMPLES

Hereinafter, the invention of the present application will be described specifically by way of examples.
<Used Printed Wiring Board>
A printed wiring board having a plated through hole was used. Particularly, an epoxy resin base was used as the printed wiring board. The base contained glass cloth, and had two layers, where the total thickness of the base was 1,600 μm. Additionally, plated through hole was plated with cupper, where the plating thickness was 30 μm. The pore size of the hole was 250 μm, and the pore length of the hole was 1,600 μm.
<Preparation of Curable Resin Composition for Hole Filling>

Preparation Examples 1 to 15

Respective components according to formulations listed in Tables 1 and 2 were mixed uniformly, thereby the curable resin compositions for hole filling were prepared (Preparation Examples 1 to 15). In Tables 1 and 2, the solvent represented Diethylene glycol ethyl ether acetate.
[Table 1]
[Table 2]
<Method for Manufacturing Hole-Filling Printed Wiring Board>

Manufacturing Examples 1 to 11, 13 and 14, and Comparative Manufacturing Examples 1 to 11 and 14 to 16

The above-described printed wiring board was dug at an opening end of a plated through hole with a drill having a diameter of 600 μm to have a depth of 800 μm, thereby removing a through hole stub.

Subsequently, the dug space and a remaining part of the plated through hole were filled with respective curable resin compositions listed in Tables 3 and 4, by screen printing under an atmospheric pressure.

Thereafter, the filling resin was initially cured under predetermined initial curing conditions shown in Tables 3 and 4 so as to obtain an initial curing rate.

Incidentally, the initial curing rate was obtained based on a reduction rate of absorbance of the hole-filling resin at an absorption peak of epoxy groups (at 910 $cm^{-1}$), which was measured by Fourier-transform infrared spectroscopy (FT-IR) before and after the curing reaction. Herein, an absorption, peak of calcium carbonate (at 873 $cm^{-1}$) was used as a contrast.

Specifically, the initial curing rate was obtained by a following formula:

Initial curing rate (%)=100*[1−{(absorbance of the hole-filling resin at the epoxy group peak after the reaction/absorbance thereof at the calcium carbonate peak)/(absorbance of the hole-filling resin at the epoxy group peak before the reaction/absorbance thereof at the calcium carbonate peak)}]

Incidentally, an initial curing rate of ink that contained no filler was obtained based on a peak reduction rate, which was calculated from absorbance at the absorption peak of epoxy groups (at 910 $cm^{-1}$) measured before and after the curing reaction.

Specifically, the initial curing rate was obtained by a following formula:

Initial curing rate (%)=100*[1−(absorbance of the hole-filling resin at the epoxy group peak after the reaction/absorbance of the hole-filling resin at the epoxy group peak before the reaction)]

Subsequently, the initially cured resin was completely cured under predetermined completely curing conditions shown in Tables 3 and 4. Thereafter, a whole surface of the printed wiring board was polished with a buff so as to be flatten.

Void generating statuses of the thus manufactured hole-filling printed wiring boards were checked. Test results were listed in Tables 3 and 4.
[Table 3]
[Table 4]

Manufacturing Example 12

Similarly to Manufacturing Example 1 except for using a printed wiring board that contained no glass cloth, a hole-filling printed wiring board was manufactured.

A void generating status of the manufactured hole-filling printed wiring board, by the Manufacturing Example 12 was checked, so that no void was generated at all.

Comparative Manufacturing Example 12

Similarly to Manufacturing Example 1 except for omitting the initial curing step, a hole-filling printed wiring board was manufactured.

A void generating status of the manufactured hole-filling printed wiring board by the Comparative Manufacturing Example 12 was checked, so that a void was observed in a part which is cut with a drill.

Comparative Manufacturing Example 13

Similarly to Manufacturing Example 1 except, for using a printed wiring board that contains no glass cloth and omitting the initial curing step, a hole-filling printed wiring board was manufactured.

A void generating status of the manufactured hole-filling printed wiring board by the Comparative Manufacturing Example 13 was checked, so that a void was observed in a part which is cut with a drill, but this void was smaller than the void observed in Comparative Manufacturing Example 12.

<Void Generating Status Test of Hole-Filling Printed Wiring Board>

The thus manufactured printed wiring boards were cut, and these cut surfaces were observed with an optical microscope (100 magnifications). Then, void generating statuses were evaluated in accordance with below-described evaluation criteria.

The evaluation was carried out based on a ratio of a cross-sectional area of a void(s) with, respect to a cross-sectional area of the dug space. In columns of the "Void generating status" in the tables, "Good" denotes 0% to 1%, "Fair" denotes 1% to 5%, and "Poor" denotes 5% or more.

<Effect and Mechanism>

Figure 3:
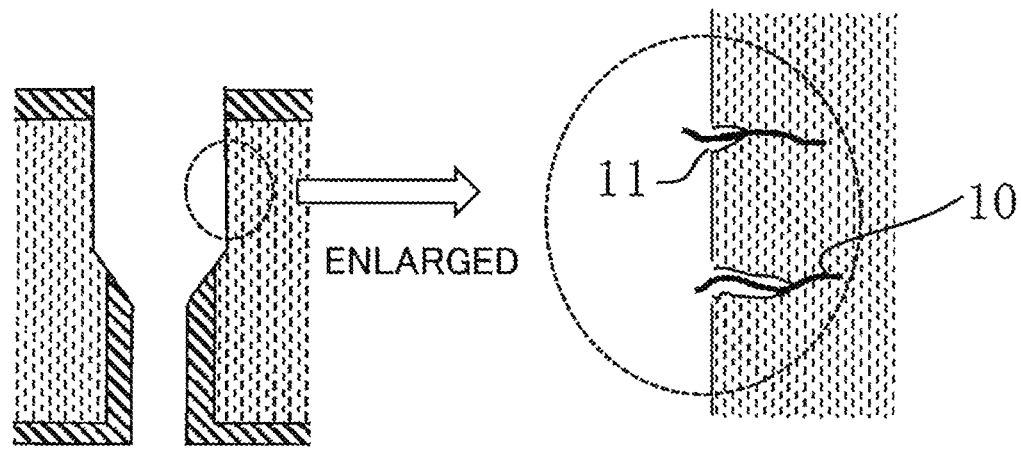
FIG. 3 is an enlarged cross-sectional view of a part that is dug with a drill.

While digging the hole-filling printed wiring board with a back drill, the glass cloth 10 (see FIG. 3) and a base caused delamination, or a part of the base was broken, thereby generating a gap 11 (see FIG. 3).

The part that was excavated with the back drill was exposed to moisture and the like in the atmosphere, because plated foil was exfoliated from the inner wall. As a result, the base absorbed much moisture (particularly in the case where the base was made of an organic material). Thus, if suddenly heating the filling resin at 100° C. or more, the (absorbed) moisture was discharged from the above-mentioned gap so as to generate a void (by vaporization).

Further, in the case of completely curing the filling resin rapidly, the filling resin was cured before the void was discharged from an inside of the filling resin to the outside, so that the void remained in the cured resin.

On the other hand, according to the invention of the present application, the filling resin was initially cured at less than 100° C. (that is, less than the boiling point of water). Thereby, the vaporization of the (absorbed) moisture (that is, the generation of a void) can be prevented.

REFERENCE SIGNS LIST

1 Plated through hole
2 Plating
3 Base
4 Dug space
5 Remaining part of plated through hole
6 Curable resin composition for hole filling
7 Exposed projection of filling resin
8 Completely cured resin
9 Void
10 Glass cloth
11 Gap

TABLE 1

| FORMULATION | PREPARATION EXAMPLE | | | | | | | |
|---|---|---|---|---|---|---|---|---|
| (PART BY MASS) | 1 | 2 | 3 | 4 | 5 | 6 | 7 | 8 |
| Epon828 | 100 | 50 | — | 100 | 100 | — | 100 | — |
| Epon807 | — | 50 | 70 | — | — | — | — | — |
| ELM-100H | — | — | — | — | — | 70 | — | 70 |
| RE-305S | — | — | 30 | — | — | 30 | — | 30 |
| FXR-1020 | 15 | — | 10 | — | — | 10 | — | 24 |
| 2E4MZ | — | 4 | — | — | — | — | — | — |
| 2MZ | — | — | — | 0.1 | 6 | — | — | — |
| MEH-8000H | — | — | — | 20 | — | — | — | — |
| EPICURE W | — | — | — | — | — | — | 25 | — |
| 2PHZ | — | — | — | — | — | — | — | — |
| 2MZA-PW | — | — | 4 | — | — | 4 | — | — |
| MH-700 | — | — | — | — | — | — | — | — |
| PN-23 | — | — | — | — | — | — | — | — |
| SILICA | 120 | 120 | — | 120 | 120 | — | 120 | — |
| CALCIUM CARBONATE | 30 | 40 | 120 | 30 | 30 | 120 | 30 | 120 |
| SOLVENT | — | — | — | — | — | — | — | — |
| SILICONE-BASED ANTIFOAMER | 2 | 2 | — | 2 | 2 | — | 2 | 2 |

TABLE 2

| FORMULATION | PREPARATION EXAMPLE | | | | | | |
|---|---|---|---|---|---|---|---|
| (PART BY MASS) | 9 | 10 | 11 | 12 | 13 | 14 | 15 |
| Epon828 | 100 | 100 | 50 | 100 | 100 | 100 | 100 |
| Epon807 | — | — | 50 | — | — | — | — |
| ELM-100H | — | — | — | — | — | — | — |
| RE-305S | — | — | — | — | — | — | — |
| FXR-1020 | — | — | — | — | — | 15 | 15 |
| 2E4MZ | — | — | — | — | — | — | — |
| 2MZ | — | — | — | 2 | — | — | — |
| MEH-8000H | — | — | — | — | — | — | — |
| EPICURE W | — | — | — | — | — | — | — |
| 2PHZ | — | 10 | — | — | — | — | — |
| 2MZA-PW | — | — | 8 | — | — | — | — |
| MH-700 | — | — | — | 88 | — | — | — |
| PN-23 | 20 | — | — | — | 20 | — | — |
| SILICA | 130 | 120 | 120 | 120 | 120 | — | 120 |
| CALCIUM CARBONATE | 20 | 30 | 40 | 30 | 30 | — | 30 |
| SOLVENT | — | — | — | — | — | — | 5 |
| SILICONE-BASED ANTIFOAMER | 2 | 2 | 2 | 2 | 2 | 2 | 2 |

TABELE 3

| | MANUFACTURING EXAMPLES | | | | | | | | | | | | |
|---|---|---|---|---|---|---|---|---|---|---|---|---|---|
| | 1 | 2 | 3 | 4 | 5 | 6 | 7 | 8 | 9 | 10 | 11 | 13 | 14 |
| USED HOLE-FILLING RESIN (PREPARATION EXAMPLE NO.) | 1 | 1 | 2 | 3 | 4 | 5 | 6 | 7 | 8 | 9 | 14 | 1 | 1 |
| INITIAL CURING CONDITION | 70° C. 240 minute | 80° C. 60 minute | 80° C. 60 minute | 80° C. 60 minute | 80° C. 90 minute | 80° C. 60 minute | 80° C. 60 minute | 80° C. 90 minute | 80° C. 60 minute | 90° C. 80 minute | 80° C. 60 minute | 80° C. 40 minute | 80° C. 120 minute |
| INITIAL CURING RATE | 70% | 71% | 61% | 62% | 62% | 65% | 69% | 69% | 73% | 70% | 71% | 60% | 85% |
| COMPLETE CURING CONDITION | 150° C. 30 minute | 150° C. 30 minute | 150° C. 30 minute | 150° C. 30 minute | 150° C. 60 minute | 150° C. 30 minute | 150° C. 30 minute | 150° C. 60 minute | 150° C. 30 minute | 150° C. 90 minute | 150° C. 30 minute | 150° C. 30 minute | 150° C. 30 minute |
| VOID GENERATING STATUS | GOOD | GOOD | GOOD | GOOD | GOOD | GOOD | GOOD | GOOD | GOOD | GOOD | GOOD | GOOD | GOOD |

TABELE 4

| | COMPARATIVE MANUFACTURING EXAMPLES | | | | | | | | | | | | | |
|---|---|---|---|---|---|---|---|---|---|---|---|---|---|---|
| | 1 | 2 | 3 | 4 | 5 | 6 | 7 | 8 | 9 | 10 | 11 | 14 | 15 | 16 |
| USED HOLE-FILLING RESIN (PREPARATION EXAMPLE NO.) | 10 | 11 | 12 | 1 | 1 | 3 | 6 | 9 | 5 | 13 | 15 | 1 | 1 | 1 |
| INITIAL CURING CONDITION | 80° C. 60 minute | 80° C. 60 minute | 80° C. 90 minute | 80° C. 15 minute | 110° C. 80 minute | 110° C. 60 minute | 110° C. 60 minute | 110° C. 60 minute | 120° C. 80 minute | 130° C. 60 minute | 80° C. 60 minute | 105° C. 30 minute | 105° C. 110 minute | 80° C. 480 minute |
| INITIAL CURING RATE | LESS THAN 30% | LESS THAN 30% | LESS THAN 30% | 57% | 88% | 90% | 91% | 93% | 91% | 90% | 71% | 70% | 85% | 90% |
| COMPLETE CURING CONDITION | 150° C. 30 minute | 150° C. 30 minute | 150° C. 30 minute | 150° C. 30 minute | 150° C. 30 minute | 150° C. 30 minute | 150° C. 30 minute | 150° C. 30 minute | 150° C. 30 minute | 150° C. 30 minute | 150° C. 30 minute | 150° C. 30 minute | 150° C. 30 minute | 150° C. 30 minute |
| VOID GENERATING STATUS | POOR | POOR | POOR | FAIR | POOR | POOR | POOR | POOR | POOR | POOR | POOR | POOR | POOR | POOR |

The invention claimed is:

1. A method for manufacturing a hole-filling printed wiring board, comprising:
    removing a redundant part of a plated through hole that is formed in a printed wiring board by a back drilling method;
    filling a penetration hole entirely with a curable resin composition for hole filling; initially heating the filled curable resin composition at a temperature less than 100° C. so that a curing rate of the curable resin composition becomes 60% to 85%; and
    subsequently heating the filled curable resin composition at a temperature 130° C. to 200° C. so as to cure the curable resin composition completely,
    wherein the curable resin composition contains 1 part by mass to 200 parts by mass of a curing agent with respect to 100 parts by mass of liquid epoxy resin, and contains no solvent.

2. The method for manufacturing a hole-filling printed wiring board according to claim 1, wherein the printed wiring board is made of a resin-based material that contains glass cloth.

3. The method for manufacturing a hole-filling printed wiring board according to claim 1, wherein the curable resin composition further contains 10 parts by mass to 1,000 parts by mass of filler.

4. The method for manufacturing a hole-filling printed wiring board according to claim 1, wherein the curable resin composition further contains a curing agent with a curing initiation temperature of 100° C. or more.

5. The method for manufacturing a hole-filling printed wiring board according to claim 1, further comprising flattening at least a part of a surface of the printed wiring board after the curable resin composition is completely cured.

6. A curable resin composition for hole filling, which is used exclusively in the manufacturing method according to claim 1.

7. A hole-filling printed wiring board, comprising:
    a penetration hole from which a stub is removed; and
    a completely cured product of the curable resin composition according to claim 6;
        wherein the penetration hole is filled entirely with the completely cured product, wherein the hole-filling printed wiring board is free of void, and wherein a surface of the hole-filling printed wiring board is flattened.

* * * * *